United States Patent [19]

Masuda et al.

[11] Patent Number: 4,633,101
[45] Date of Patent: Dec. 30, 1986

[54] SEMICONDUCTOR SAMPLE AND HOLD SWITCHING CIRCUIT

[75] Inventors: Eiji Masuda, Kawasaki; Kenji Matsuo, Yokohama, both of Japan

[73] Assignee: Tokyo Shibaura Denki Kabushiki Kaisha, Kawasaki, Japan

[21] Appl. No.: 735,291

[22] Filed: May 17, 1985

Related U.S. Application Data

[63] Continuation of Ser. No. 421,073, Sep. 22, 1982.

[30] Foreign Application Priority Data

Oct. 31, 1981 [JP] Japan ................................. 56-173788

[51] Int. Cl.[4] ................... H03K 17/06; H03K 19/003; H03K 19/096; H03K 17/687
[52] U.S. Cl. .................................... 307/353; 307/450; 307/240; 307/571; 307/584; 307/355; 377/58
[58] Field of Search ............... 307/480, 482, 471, 472, 307/452, 451, 491, 494, 496, 497, 498, 500, 501, 511, 352, 353, 572, 577, 579, 601, 582–585, 603, 605, 607, 253, 355, 240, 243, 571, 450; 377/57–63; 330/9

[56] References Cited

U.S. PATENT DOCUMENTS

| | | | |
|---|---|---|---|
| 3,268,827 | 8/1966 | Carlson et al. ................. | 307/577 X |
| 3,657,568 | 4/1972 | Dargent ........................... | 307/585 X |
| 3,688,208 | 8/1972 | Kandiah .......................... | 307/353 X |
| 3,745,372 | 10/1973 | Koster ............................. | 307/584 X |
| 3,872,325 | 3/1975 | Adams et al. ................... | 307/251 |
| 3,983,414 | 9/1976 | Stafford et al. ................. | 307/578 |
| 4,038,568 | 7/1977 | May et al. ....................... | 307/353 X |
| 4,075,509 | 2/1978 | Redfern .......................... | 307/577 |
| 4,197,472 | 4/1980 | Aoki et al. ...................... | 307/355 |
| 4,399,417 | 8/1983 | Ballantyne et al. ............. | 357/230 X |

FOREIGN PATENT DOCUMENTS

| | | | |
|---|---|---|---|
| 103652 | 8/1979 | Japan ............................... | 307/353 |
| 164369 | 5/1983 | Japan ............................... | 307/353 |

OTHER PUBLICATIONS

Tozer, R. C., "Sample and Hold Gates Using Field Effect Transistors", Electronic Engineering, pp. 47–49, Mar. 1976.

*Designing with Field Effect Transistors*, Siliconix Inc., McGraw-Hill Book Co., pp. 270–271, 1981.

Graeme, *Applications of Operational Amplifiers: Third–Generation Techniques*, McGraw-Hill Book Company, pp. 21–25, 1973.

Ricardo E. Suarez et al., "All-MOS Charge Redistribution Analog-to-Digital Conversion Technique-Part II" IEEE Solid-State Circuits, vol. SC-10, pp. 379–385 (Dec. 1975).

Primary Examiner—Stanley D. Miller
Assistant Examiner—David R. Bertelson
Attorney, Agent, or Firm—Finnegan, Henderson, Farabow, Garrett & Dunner

[57] ABSTRACT

A semiconductor switching circuit includes a MOS inverter and a switching MOS transistor for executing a switching operation in response to the output signal from the MOS inverter. The semiconductor switching circuit further includes a low-pass filter coupled between the MOS inverter and the gate of the switching MOS transistor.

10 Claims, 16 Drawing Figures

SEMICONDUCTOR SAMPLE AND HOLD SWITCHING CIRCUIT

This application is a continuation, of application Ser. No. 421,073, filed Sept. 22, 1982.

BACKGROUND OF THE INVENTION

The present invention relates to a semiconductor switching circuit.

There have recently been developed complicated but highly sophisticated MOS semiconductor integrated circuits capable of processing both digital and analog signals, such as analog/digital converters, digital-/analog converters, switching capacitor filters or CO-DEC. An analog circuit section of the semiconductor integrated circuit contains analog circuit components such as MOS switch capacitors, amplifier circuits and resistor networks. For realizing such a complicated but highly sophisticated semiconductor integrated circuit, it is required to improve the circuit characteristics of these analog circuit elements.

Figure 1:
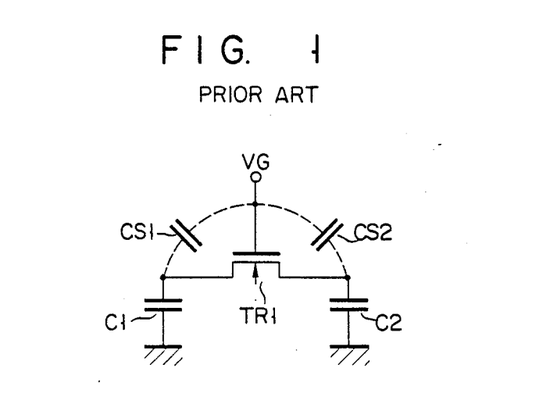
FIG. 1 is a circuit diagram of a semiconductor circuit with a prior art MOS switching circuit which takes no measures for the feedthrough phenomenon problem.

A circuit characteristic of a MOSFET used as a MOS switch of the analog circuit elements will be described. FIG. 1 illustrates an n-channel MOSFET TR1 used as a MOS switch for transferring a signal charge stored in a capacitor C1 to a capacitor C2 according to a drive signal VG. The capacitors C1 and C2 are coupled between the drain of the MOS transistor TR1 and ground, and between the source of the transistor TR1 and ground, respectively. Parasitic capacitors CS1 and CS2 are respectively associated between the drain and the gate, and the source and the gate of the MOS transistor TR1.

It is assumed that, in the MOS switching circuit shown in FIG. 1, the capacitors C1 and C2 have been respectively charged up to voltages V1 and V2 where V1 is larger than V2 in their initial state. Under this condition, when a high level drive signal or gate voltage VG is applied to the gate of the MOS transistor TR1, the MOS transistor TR1 is rendered conductive and the charge stored in the capacitor C1 is transferred through the MOS transistor TR1 to the capacitor C2. After the charge transfer is completed, the gate voltage VG is set low and the MOS transistor TR1 is rendered nonconductive. In this case, if the capacitances of the capacitors C1 and C2 are equal to each other, the charge voltage across the capacitors C1 and C2 must be both $(V1+V2)/2$ at the completion of the charge transfer. In fact, however, the gate voltage VG is partially applied to the capacitors C1 and C2 through the nonlinear parasitic capacitors CS1 and CS2 on the MOS transistor TR1, so that a feedthrough error voltage VFC is superposedly applied to the capacitors C1 and C2. Accordingly, the charge voltages of the capacitors C1 and C2 are each given by $[(V1+V2)/2+VFE]$. That is, the charge voltages of teh capacitors C1 and C2 are offset by an amount of the feedthrough error voltage. The feedthrough phenomenon arises from the parasitic capacitances associated with the MOS transistor. In some types of process controls, the adverse influence by the feedthrough phenomenon is unavoidable. In a situation requiring a high precision circuit characteristic, some measure must be taken for suppressing the adverse influence by the feedthrough phenomenon.

Figure 2:
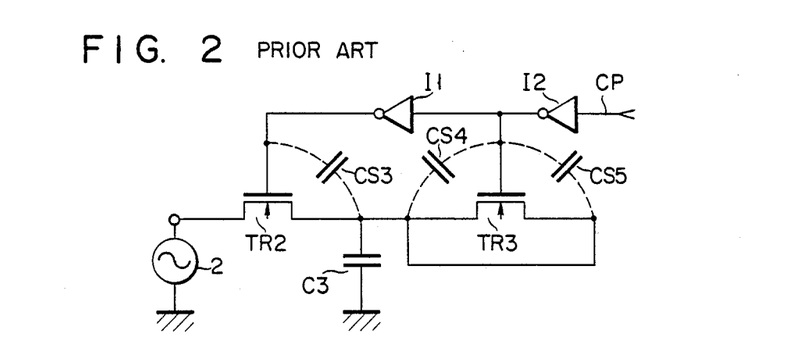
FIGS. 2 and 3 are circuit diagrams of a prior art MOS switching circuit and a prior art semiconductor circuit with a MOS transistor for compensating for the feedthrough error.
Figure 3:
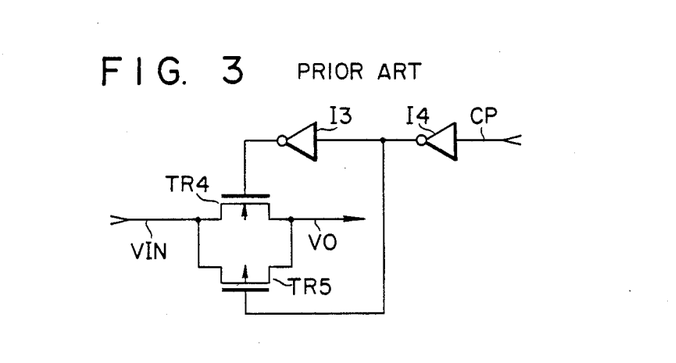

FIGS. 2 and 3 show prior art semiconductor circuits including semiconductor switching circuits with function for suppressing the adverse influence by the feedthrough phenomenon.

A semiconductor circuit shown in FIG. 2 is a sample/hold circuit for sampling and holding an analog input signal from a signal generator 2 according to a drive signal CP. The sample/hold circuit is provided with an n-channel MOS transistor TR2 whose conduction state is controlled in accordance with the drive signal CP and charges a capacitor C3 with a charge voltage corresponding to the analog input signal, and an n-channel MOS transistor TR3 which has a source and drain coupled with a drain of the MOS transistor TR2 and a gate connected to receive an inverted drive signal $\overline{CP}$. The MOS transistor TR2 receives an original drive signal CP via MOS inverters I1 and I2 at the gate and the MOS transistor TR3 receives the output signal $\overline{CP}$ from the MOS inverter I2 at the gate. In this circuit, a capacitor CS3 is associated between the gate and the drain of the MOS transistor TR2, and capacitors CS4 and CS5 are respectively associated between the gate and the source, and between the gate and the drain of the MOS transistor TR3. On the basis of this fact, the dimensions of the MOS transistors TR2 and TR3 are selected so that the capacitance of the capacitor CS3 is equal to the sum of the capacitances of the capacitors CS4 and CS5. With such a design of the switching circuit, if all of the parasitic capacitors CS3 to CS5 are of the linear type, the adverse influence on the charge voltage of the capacitor C3, which is caused by the feedthrough phenomenon in the MOS transistor TR2, may be offset by the feedthrough phenomenon in the MOS transistor TR3.

A semiconductor circuit shown in FIG. 3 is provided with an n-channel MOS transistor TR4 for generating an output signal VO corresponding to an input signal VIN in response to a drive signal CP, and a p-channel MOS transistor TR5 having a current path coupled in parallel with the current path of the MOS transistor TR4 and receiving at the gate a drive signal $\overline{CP}$. In this circuit, an original drive signal CP is supplied to the gate of the MOS transistor TR4 through MOS inverters I3 and I4, and an inverted output signal $\overline{CP}$ is applied to the gate of the MOS transistor TR5. In this semiconductor circuit, the dimensions of the MOS transistors TR4 and TR5 are so selected that the parasitic capacitors between the gate and the source, and between the gate and the drain of the MOS transistor TR5 are equal to each other. The adverse influence on the source and drain potentials, which is caused by the feedthrough phenomenon occurring in the MOS transistor TR4 is canceled by the adverse influence caused by the feedthrough phenomenon occurring in the MOS transistor TR5.

The semiconductor circuits shown in FIGS. 2 and 3 employ drive signals CP and $\overline{CP}$, which are out of phase and formed of the MOS transistors for driving the pair of MOS transistors TR2 and TR3 and the pair of the MOS transistors TR4 and TR5. It is estimated by the inventors in the present patent application that this will give rise to the following problems.

(i) A phase shift occurs between the drive signals CP and $\overline{CP}$.

(ii) Since a coupling capacitor is a parasitic capacitor associated between the input and output terminals of the MOS inverter, an undershoot component and an overshoot component will be contained in the drive signals CP and $\overline{CP}$.

(iii) All of the parasitic capacitors associated with the MOS transistor are of the nonlinear type.

(iv) A feedthrough phenomenon takes place through the nonlinear capacitor formed between the gate and the channel of each of the MOS transistors TR2 and TR4 operating as switches.

The combined problems (i) to (iv) above exert an adverse influence on the switching circuit, so that the prior art semiconductor switching circuits may not sufficiently suppress the adverse influence of the feedthrough phenomenon and can not reduce the offset voltage to a sufficiently small value. Nevertheless, the adverse influence of the feedthrough phenomenon originates from the presence of the nonlinear parasitic capacitors-and the inventors in the present patent application found that the feedthrough error may vary depending largely on problems (i) and (ii) among the problems (i) to (iv).

SUMMARY OF THE INVENTION

Accordingly, an object of the present invention is to provide a semiconductor switching circuit which suppresses the offset voltage to a minimum.

According to one aspect of the present invention, there is provided a semiconductor switching circuit comprising drive signal generating means including at least one MOS transistor for generating a drive signal, a switching MOS transistor for executing a switching operation is response to a drive signal from the drive signal generating means, and low-pass filter means coupled between the gate of the switching MOS transistor and the drive signal generating means.

DETAILED DESCRIPTION OF THE PREFERRED EMBODIMENTS

Figure 4:
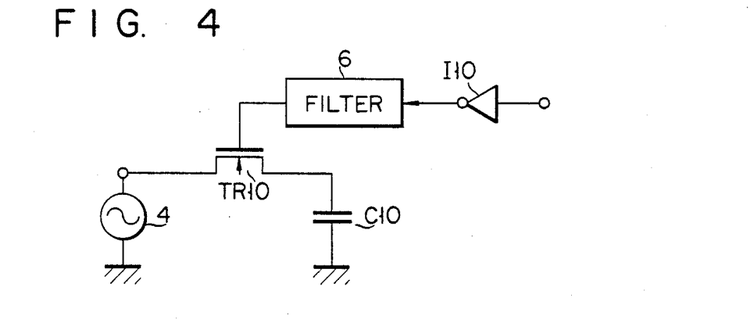
FIG. 4 is a circuit diagram of a sample/hold circuit including a semiconductor switching circuit according to one embodiment of the present invention.

In FIG. 4, there is shown a sample/hold circuit with a semiconductor switching circuit according to an embodiment of the present invention. The sample/hold circuit is formed of an n-channel switching MOS transistor TR10, a signal generator 4 and a capacitor C10 respectively connected to the source and the drain of the MOS transistor TR10, a MOS inverter I10 for forming a drive signal CP, and a low-pass filter 6 inserted between the MOS inverter I10 and the gate of the MOS transistor TR10. In the sample/hold circuit, the conduction state of the switching MOS transistor TR10 is controlled according to a drive signal CP supplied through the filter 6 from the MOS inverter I10. In this control operation, when the MOS transistor TR10 is rendered conductive, a charge voltage corresponding to an analog signal is supplied from the signal generator 4 to the capacitor C10, thereby charging the capacitor.

With the insertion of the low-pass filter 6 between the gate of the switching MOS transistor TR10 and the MOS inverter I10 for forming the drive pulse CP, an undershoot component and an overshoot component contained in the output pulse CP from the MOS inverter I10 are removed, so that a gate voltage, which keeps increasing or decreasing at a relatively gentle change rate, is applied to the gate of the MOS transistor TR10. The result is that the influence of the feedthrough effect by the parasitic capacitor associated between the gate and the drain of the switching MOS transistor TR10 is made extremely small and hence the feedthrough error voltage can be reduced to a minimum. Consequently, the offset voltage is minimized and the input signal can be sampled and held with high accuracy.

Figures 5, 6:
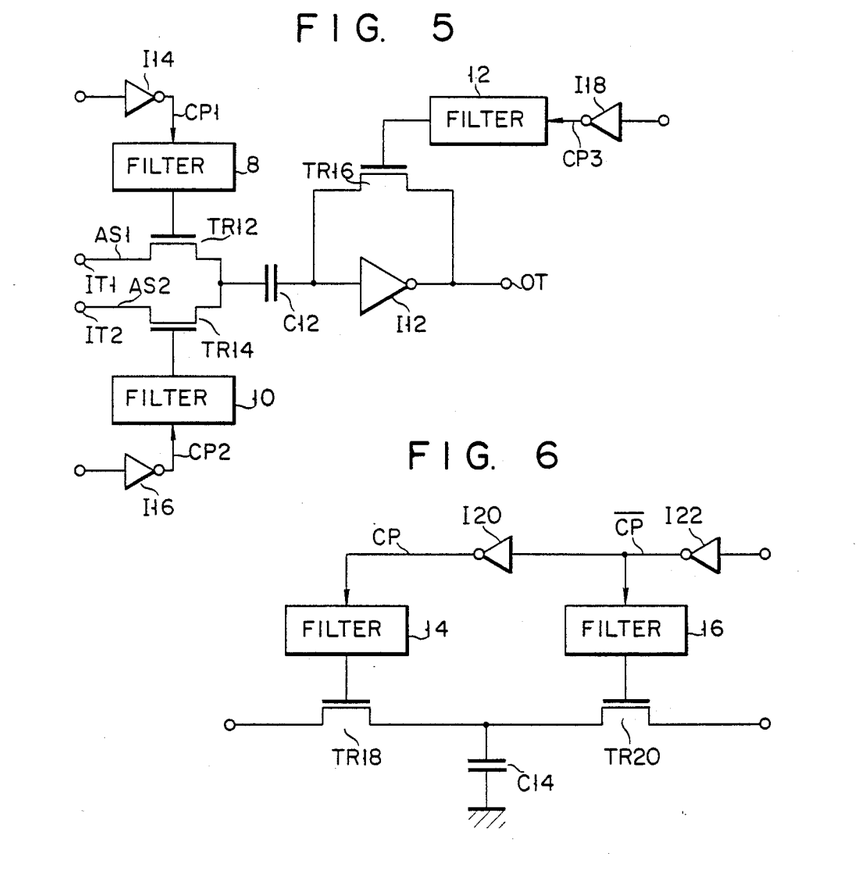
FIG. 5 is a circuit diagram of a chopper-type comparing circuit including a plurality of semiconductor switching circuits according to an embodiment of the present invention.
FIG. 6 is a circuit diagram of a switched capacitor filter circuit including a plurality of semiconductor switching circuits according to an embodiment of the present invention.

FIG. 5 shows a chopper-type comparing circuit including a plurality of the semiconductor switching circuits according to one embodiment of the present invention. The comparing circuit is formed of a capacitor C12, switching transistors TR12 and TR14 inserted between one end of the capacitor C12 and signal input terminals IT1 and IT2, a MOS inverter I12 coupled between an output terminal OT and the other end of the capacitor C12, and a switching MOS transistor TR16 having a current path coupled between the input and the output terminals of the MOS inverter I12. The gates of the MOS transistors TR12, TR14 and TR16 are connected through low-pass filters 8, 10 and 12 to the output terminals of MOS inverters I14, I16 and I18 for forming drive signals CP1 to CP3 to drive these MOS transistors TR12, TR14 and TR16, respectively.

In the comparing circuit, a drive pulse CP3 is first applied from the MOS inverter I18 to the gate of the MOS transistor TR16, through the low-pass filter 12, thereby to making the MOS transistor TR16 conductive. As a result, the input and the output terminals of the MOS inverter I12 are short-circuited to set the potential at the input of the MOS inverter I12 at the inverting threshold voltage of the inverter I12. Then, the MOS transistor TR16 is made nonconductive and a drive signal CP1 is applied from the MOS inverter I14 to the gate of the MOS transistor TR12, via the low-pass filter 8, thereby turning on the MOS transistor TR12. Then, an analog input signal AS1 supplied to the input terminal IT1 is fed to the capacitor C12. Following this, the MOS transistor TR12 is made nonconductive and a drive signal from the MOS inverter I16 is applied through the low-pass filter 10 to the gate of the MOS transistor TR14, thereby turning on the MOS transistor TR14. Accordingly, an analog signal AS2 supplied to the input terminal IT2 is fed to the capacitor C12. In this way, the voltage at the input terminal of the MOS inverter I12 is changed from VO to "VO+(AS1−AS2)", and this changed voltage is inverted and amplified by the MOS inverter I12 and is taken out from the output terminal OT.

In the comparing circuit shown in FIG. 5, the low-pass filters 8, 10 and 12 are respectively coupled between the switching MOS transistors TR12, TR14 and TR16 and the MOS inverters I14, I16 and I18 for forming the drive signals CP1, CP2 and CP3. With this circuit arrangement, if the undershoot and overshoot components are contained in the drive signals CP1, CP2 and CP3 due to the presence of the parasitic capacitors between the input and output terminals of the MOS inverters I14, I16 and I18, such noise components are removed by the low-pass filters 8, 10 and 12. As a result, the influence of the feedthrough effect due to the parasitic capacitors between the gate and drain and between the gate and the source of each of the switching MOS transistors TR12, TR14 and TR16, is extremely diminished, with the result that the comparing circuit executes the comparison of the input signals AS1 and AS2 with relatively high precision.

FIG. 6 shows a switched capacitor circuit. The switched capacitor circuit is provided with switching MOS transistors TR18 and TR20 of the same channel type coupled in series between two terminals, and a capacitor C14 coupled between a junction of the MOS transistors TR18 and TR20 and the ground. The gates of the MOS transistors TR18 and TR20 are connected to the output terminals of the MOS inverters I20 and I22 for forming drive signals CP and $\overline{CP}$ through low-pass filters 14 and 16.

The switched capacitor circuit alternately switches the switching MOS transistors TR18 and TR20 in response to the drive signals CP and $\overline{CP}$ to serve as a resistor circuit exhibiting a resistance inversely proportional to the frequency of the drive signals CP and $\overline{CP}$.

Also in the embodiment shown in FIG. 6, the low-pass filters 14 and 16 are respectively coupled between the gates of the switching MOS transistors TR18 and TR20 and the output terminals of the MOS inverters I20 and I22 for generating the drive signals CP and $\overline{CP}$. Accordingly, the undershoot and overshoot components contained in the drive signals CP and $\overline{CP}$ may be removed. As a result, the adverse influence by the feedthrough effect due to the parasitic capacitances present between the gate and the drain and between the gate and the source of each of the MOS transistors TR18 and TR20 may be reduced to an extremely small degree. In the present embodiment, the filters 14 and 16 each have a function to smooth the rise and the fall characteristics of each of the drive signals CP and $\overline{CP}$ derived from the inverters I20 and I22. Therefore, the characteristics of the filters 14 and 16 may differ such that the rise and the fall characteristics of the drive signal CP applied to the gate of the MOS transistor TR18 are sharper than those of the drive signal $\overline{CP}$. This results in reduction in phase difference between the drive signals CP and $\overline{CP}$ applied to the gates of the MOS transistors TR18 and TR20. With such an arrangement, a resistance which is precisely proportional to the frequency of the drive signals CP and $\overline{CP}$ can be obtained.

Figure 7:
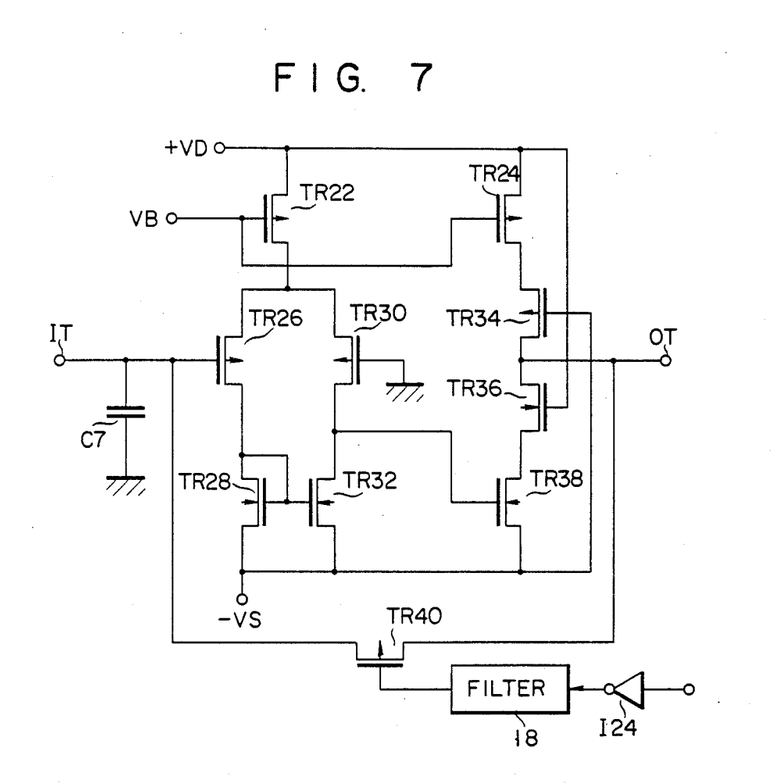
FIG. 7 is a circuit diagram of a voltage comparing circuit with a semiconductor switching circuit according to an embodiment of the present invention.

FIG. 7 shows a voltage comparator with semiconductor switching circuits as an embodiment according to the present invention. The voltage comparator is comprised of p-channel MOS transistors TR22 and TR24 connected at the source to a positive power source terminal +VD, p-and n-channel MOS transistors TR26 and TR28 connected in series between the drain of the MOS transistor TR22 and a negative power source terminal −VS, and p- and n-channel MOS transistors TR30 and TR32 connected in series between the drain of the MOS transistor TR22 and the negative power source terminal −VS, and p-, n- and n-channel MOS transistors TR34, TR36 and TR38 connected in series between the drain of the MOS transistor TR24 and the negative power source terminal −VS. The gates of the MOS transistors TR22 and TR24 are connected to a power source terminal VB, the gate of the MOS transistor 28 is connected to its drain, and the gate of the MOS transistor TR30 is grounded. The gates of the MOS transistors TR34 and TR36 are connected to the positive and the negative power source terminals +VD and −VS, respectively. The gate of the MOS transistor TR38 is connected to the drain of the MOS transistor TR32. The gate of the MOS transistor TR24 is coupled with the input terminal IT and a junction between the MOS transistor TR34 and TR36 is coupled with the output terminal OT. The voltage comparator is further comprised of a capacitor C7 coupled between the input terminal IT and ground, a p-channel switching MOS transistor TR40 connected between the input terminal IT and the output terminal OT, a CMOS inverter I24 for forming a drive signal $\overline{CP}$, and a low-pass filter 18 coupled between the CMOS inverter I24 and the gate of the MOS transistor TR40.

The voltage comparator compares a charge voltage across the capacitor C7 with a ground potential in response to an input signal supplied to the input terminal IT. In operation, the MOS transistors TR22, TR24, TR34 and TR36 are conductive. Before the comparing operation, the drive signal $\overline{CP}$ from the CMOS inverter I24 is applied to the gate of the MOS transistor TR40 through the low-pass filter 18, thereby rendering the MOS transistor TR40 conductive. As a result, an offset voltage at the output terminal OT is removed. Then, when the capacitor C7 is charged up to a positive voltage according to an input signal applied to the input terminal IT, the MOS transitors TR26 and TR30 are rendered nonconductive and conductive, respectively. As a result, the MOS transistor TR38 is made conductive and a low level signal is generated from the output terminal OT. On the other hand, when the capacitor C7 is charged to a negative voltage according to an input signal, the MOS transistors TR26 and TR30 are rendered conductive and nonconductive, respectively, and then the MOS transistor TR38 is made nonconductive and a high level signal is produced from the output terminal OT.

Also, in the circuit shown in FIG. 7, a low-pass filter 18 is connected between the gate of the MOS transistor TR40 performing a switching operation and the CMOS inverter I24 and removes the undershoot component and the overshoot component appearing in the drive signal $\overline{CP}$. Therefore, the adverse influence by the feedthrough phenomenon due to the parasitic capacitor existing between the gate and the drain of the MOS transistor TR40 and between the gate and the source of the same may be reduced to the minimum.

Figure 8:
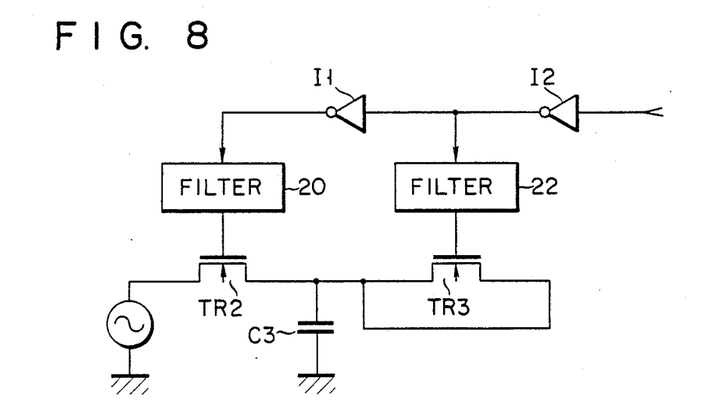
FIG. 8 is a circuit diagram of a sample/hold circuit including a plurality of semiconductor switching circuits according to one embodiment of the present invention.

FIG. 8 shows a sample/hold circuit which has the same arrangement as the sample/hold circuit shown in FIG. 2 except that a MOS inverter I1 and the gate of the MOS transistor TR2, and a low-pass filter 22 is connected between the MOS inverter I2 and the MOS transistor TR3.

In the circuit shown in FIG. 8, because of the use of the feedthrough compensating MOS transistor TR3, the adverse influence of the feedthrough phenomenon in the MOS transistor TR2 is canceled by that of the feedthrough phenomenon in the MOS transistor TR3. Further, the drive signals CP and $\overline{CP}$ are applied through the low-pass filters 20 and 22 to the gates of the MOS transistors TR2 and TR3. Therefore, the undershoot and the overshoot components produced in the drive signals CP and $\overline{CP}$ are removed and the feedthrough error voltage in the MOS transistors TR2 and TR3 per se may be suppressed to the minimum. Further, a phase error between the drive signals CP and $\overline{CP}$ applied to the gates of the MOS transistors TR2 and TR3 may be reduced to a small value by varying the characteristics of the filters 20 and 22 so that the rise and the fall characteristics of the drive signal CP from the inverter I1 is sharper than the drive signal $\overline{CP}$ from the inverter I2. In this way, the offset voltage produced in the switching MOS transistor TR2 may be limited to a low level.

Figure 9:
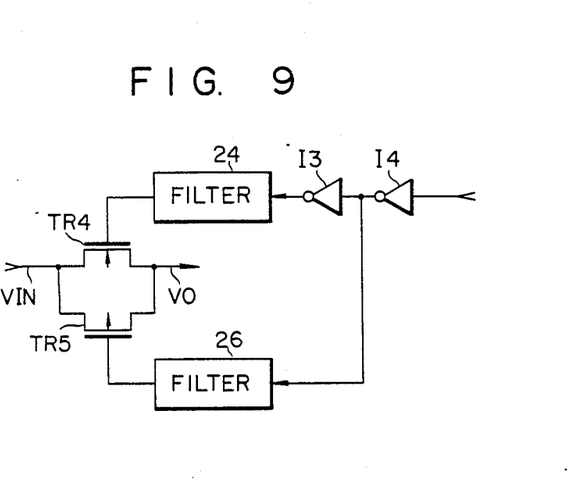
FIG. 9 is a circuit diagram of a semiconductor circuit with a semiconductor switching circuit according to an embodiment of the present invention.

A semiconductor circuit shown in FIG. 9 has the same arrangement as the arrangement shown in FIG. 3, except that a low-pass filter 24 is coupled between a MOS inverter I3 and the gate of a MOS transistor TR4, and a low-pass filter 26 is connected between a MOS inverter I4 and the gate of a MOS transistor TR5.

Also the semiconductor circuit shown in FIG. 9 uses the feedthrough compensating MOS transistor TR5, and the low-pass filters 24 and 26 for removing the undershoot component and the overshoot component contained in the drive signals CP and $\overline{CP}$. The adverse influence by the feedthrough phenomenon in the MOS transistor TR4 is suppressed to the minimum and thus the offset voltage in the MOS transistor TR4 is reduced to an extremely small value. Further, if the circuit of the present embodiment is so designed that the filters 24 and 26 have different characteristics, it is possible to reduce a phase error between the drive signals CP and $\overline{CP}$ and applied to the gates of the MOS transistors TR4 and TR5.

Figure 10:
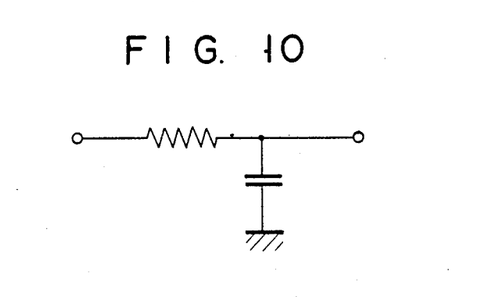
FIGS. 10 and 11 are circuit diagrams of low-pass filter circuits used in the semiconductor switching circuits in FIGS. 4 to 9.
Figure 11:
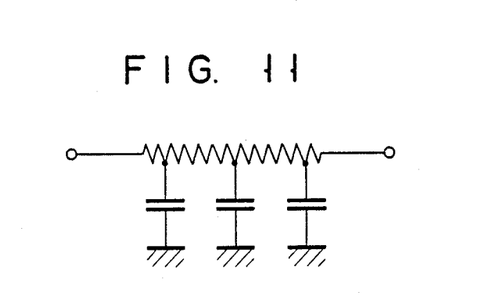

FIGS. 10 and 11 show examples of the low-pass filter used in each of the semiconductor circuits shown in FIGS. 4 to 9. FIG. 10 shows a CR filter formed of a resistor connected between the input and the output terminals and a capacitor connected between the output terminal and ground. FIG. 11 shows a CR filter formed of a resistor coupled between the input and the output terminals and capacitors connected between a plurality of points on the resistors and ground.

Figure 12:
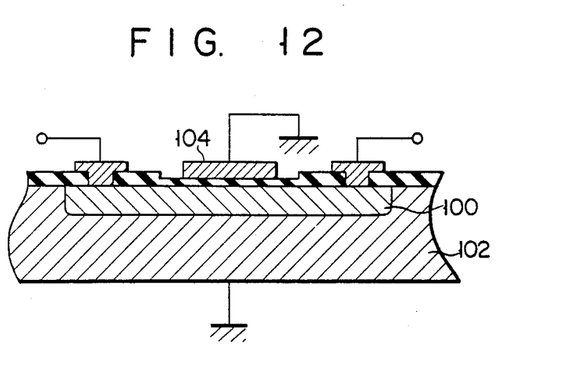
FIGS. 12 to 14 structurally illustrate semiconductor devices each forming the low-pass filter used in the semiconductor switching circuits of FIGS. 4 to 9.
Figure 13:
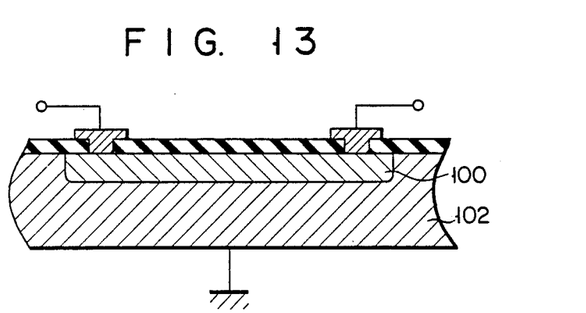
Figure 14:
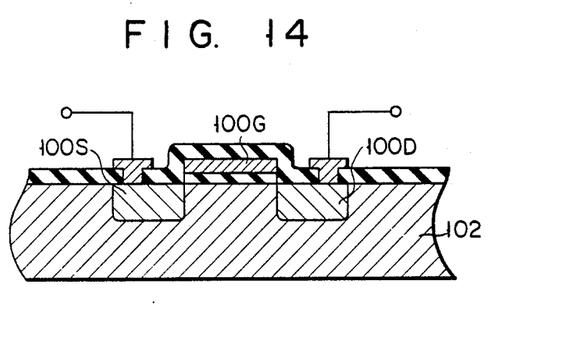

FIGS. 12 to 14 show structural arrangements of the CR filters shown in FIGS. 10 and 11.

The CR filter shown in FIG. 12 includes a diffusion layer 100 serving as a resistor, which is formed in a grounded semiconductor substrate 102 and of the opposite conductivity to that of the substrate 102, and a grounded conductive layer 104 insulatively formed on the diffusion layer 100. In the CR filter with such a structure, input and output electrodes are formed in contact with both ends of the diffusion layer 100, and a p-n junction type capacitance formed between the diffusion layer and the semiconductor substrate 102 and a capacitor formed between the conductive layer 104 and the diffusion layer 100 are each coupled between the diffusion layer 100 as the resistor and ground.

The structure of the CR filter shown in FIG. 13 is the same as that of FIG. 12 except that the conductive layer 104 is omitted. In this case, only the p-n junction type capacitance formed between the diffusion layer 100 and the semiconductor substrate 102 is coupled between the diffusion layer 100 as the resistor and ground.

The CR filter shown in FIG. 14 is provided with source and drain regions 100S and 100D formed in the surface area of a semiconductor substrate 102 and having the opposite conductivity to that of the substrate, and a gate electrode 100G insulatively formed on the substrate 102 between the source and the drain regions 100S and 100D. A channel path formed by applying a given gate voltage to the gate electrode 100G is used as a resistive component and junction type capacitors between the substrate 102 and the source and drain regions 100S and 100D are used as a capacitive component.

The CR time constant in each of the CR filters shown in FIGS. 12 to 14 is selected to be several nsec to several hundreds nsec so as to be equal to the rise time or the fall time of the drive signal from the MOS inverter or CMOS inverter used in each of the semiconductor circuits shown in FIGS. 4 to 9. Further, a parasitic capacitance existing between the gate of the switching MOS transistor to be controlled and the substrate may be used as the capacitive component in this type of the CR filter. Actually, various parasitic capacitances exist in the semiconductor circuit shown in FIGS. 4 to 9. For example, a CR filter can be formed by forming only the resistive element and using the parasitic capacitor as the capacitive element. Additionally, the resistive element may be formed of a polycrystalline silicon layer formed on the semiconductor substrate, in place of the diffusion layer.

Figure 15:
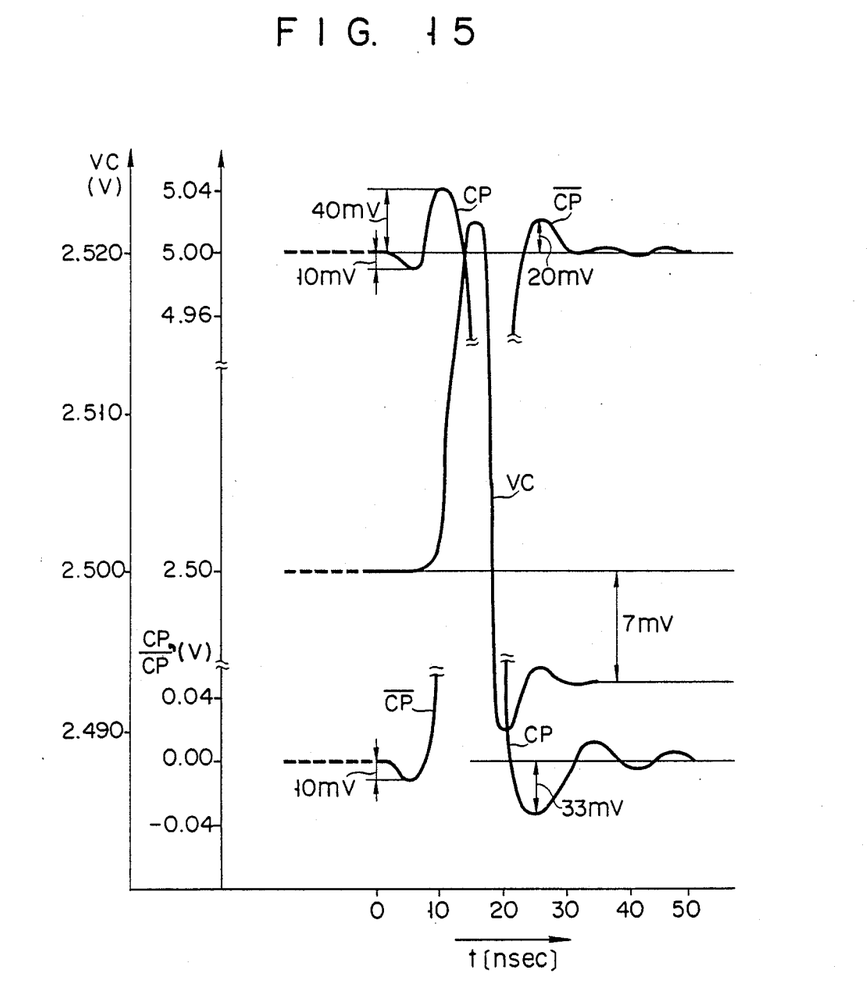
FIGS. 15 and 16 show characteristic curves of the semiconductor circuits shown in FIGS. 2 and 8.
Figure 16:
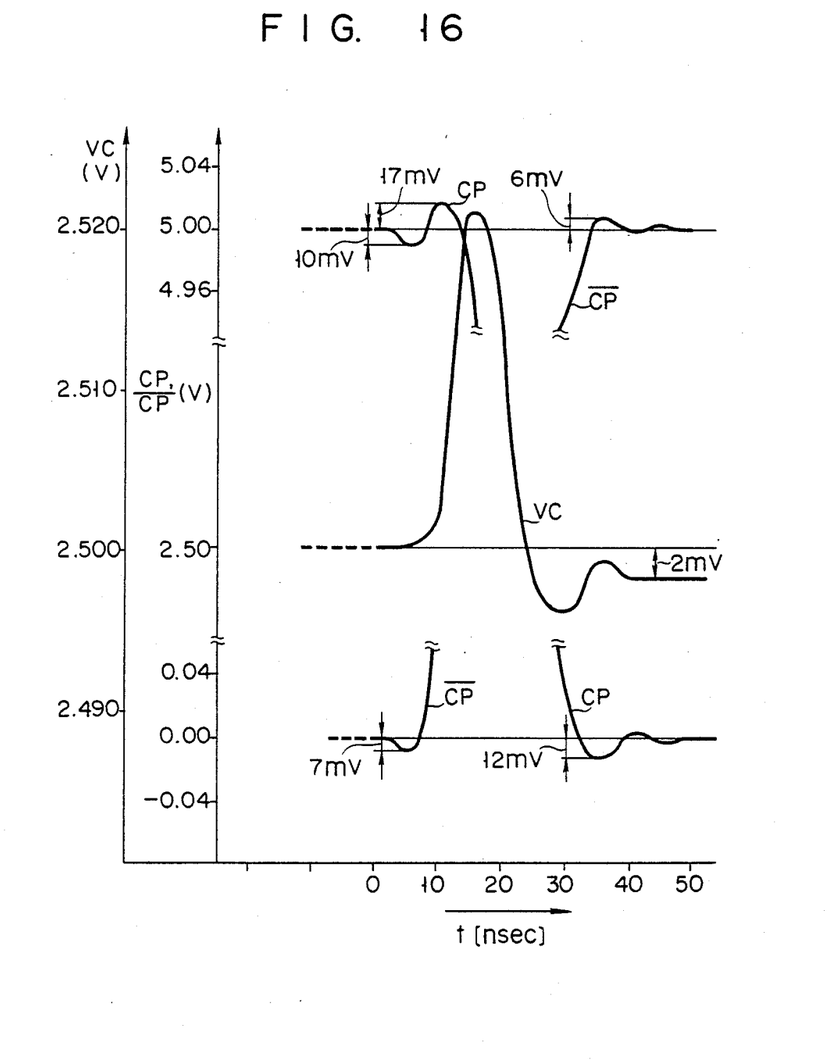

FIGS. 15 and 16 show waveforms of drive signals CP and $\overline{CP}$ applied to the gates of the MOS transistors TR2 and TR3, the drain voltage of the MOS transistor TR2 or an input voltage VC to the capacitor C3 in the sample/hold circuit shown in FIGS. 2 and 8 when a drive signal falling from 5 V to 0 V is applied to the MOS inverter I2 and an analog input signal 2.5 V is applied to the source of the MOS transistor TR2. In this experiment, the channel width W and the channel length L of the MOS transistor TR2 are 14 μm and 7 μm, and those of the MOS transistor TR3 are both 7 μm. In the sample/hold circuit shown in FIG. 8, each of the filter circuits 20 and 22 is a low-pass filter formed of a resistor which has a resistance of 1 kΩ and a capacitor which has a capacitance of 0.5 pF.

As seen from voltage waveforms of the drive signals in FIG. 15, the overshoot and undershoot components are 40 mV and 33 mV when the drive signal CP falls, and are 10 mV and 20 mV when the drive signal $\overline{CP}$ rises. In this case, the feedthrough phenomenon has an influence upon the input voltage VC, as described, and an offset voltage of approximately 7 mV appears in the input voltage VC.

As seen from the voltage waveforms shown in FIG. 16, the overshoot and undershoot components are 17 mV and 12 mV when the drive signal CP falls. The undershoot and overshoot components are 7 mV and 6 mV when the drive signal $\overline{CP}$ rises. In this way, the overshoot and undershoot components contained in the drive signals CP and $\overline{CP}$ are remarkably reduced, so that the offset voltage appearing in the input signal VC to the capacitor C3 is held down to approximately 2 mV.

While the invention has been described using some specific embodiments, it should be understood that the present invention is not limited to such specific embodiments. For example, the MOS or CMOS inverter for forming the drive signals CP and $\overline{CP}$ may be replaced by a NAND or NOR circuit formed of MOS transistors. In this case, the NAND or NOR circuit may be formed of single-channel MOS transistors or CMOS transistors.

The low-pass filter of the semiconductor switching circuit used in the semiconductor circuit shown in FIGS. 4 to 9 are formed of a CR filter, but can be formed by further using an inductance element, for example.

What we claim is:

1. In a semiconductor circuit comprising input means for receiving an input voltage; output means; a reference voltage terminal; pulse signal generating means for generating a pulse signal; a switching MOS transistor having a gate connected to receive said pulse signal and a channel connected between said input and output means, which switching MOS transistor operates in a conductive or nonconductive mode for executing a switching operation in response to the pulse signal from said pulse signal generating means; and first capacitive means, connected between said input means and said reference voltage terminal, for receiving an input signal applied to said input means when said switching MOS transistor is in conductive mode and for holding a voltage corresponding to the input voltage and a feedthrough error voltage from said pulse signal delivered to said first capacitive means through the gate-channel path of said switching MOS transistor after said switching MOS transistor switches from a conductive to a nonconductive mode, the improvement comprising:
   means for reducing said feedthrough error voltage comprising a low-pass filter circuit coupled between the gate of said switching MOS transistor and said pulse signal generating means and having a time constant selected to reduce undershoot and overshoot components of said pulse signal.

2. A semiconductor circuit according to claim 1, wherein said filter circuit is formed of resistive means and second capacitive means.

3. A semiconductor circuit according to claim 2, wherein said second capacitive means includes a junction type capacitor formed between a semiconductor substrate and a semiconductor region formed in the surface area of said semicondcutor substrate, and said resistive means is formed of said semiconductor region.

4. A semiconductor circuit according to claim 2, wherein said second capacitive means includes a capacitor formed of a semiconductor region formed in the surface area of a semiconductor substrate and a conductive layer insulatively formed on said semiconductor region.

5. A semiconductor circuit according to claim 1 or 2 wherein said pulse signal generating means includes a first signal generating section for generating a first pulse signal and a second signal generating section for inverting the first pulse signal and supplying the inverted first pulse signal to said low-pass filter circuit and wherein said time constant of said low-pass filter circuit is selected to reduce undershoot and overshoot components of said inverted pulse signal.

6. A semiconductor circuit according to claim 5, further comprising a compensation MOS transistor of the same channel type as that of said switching MOS transistor, said compensation MOS transistor being connected at the drain and source to the drain of said switching MOS transistor, and a second low-pass filter circuit coupled between the gate of said compensation MOS transistor and said first signal generating section, said second low-pass filter circuit having a time constant selected to reduce undershoot and overshoot components of said first pulse signal.

7. A semiconductor circuit according to claim 5, further comprising another swtiching MOS transistor whose source is connected to the drain of said switching MOS transistor and whose conductivity is the same as that of said switching MOS transistor, and a second low-pass filter circuit coupled between the gate of said another switching MOS transistor and said first signal generating section, said second low-pass filter circuit having a time constant selected to reduce undershoot and overshoot components of said first pulse signal.

8. In a semiconductor circuit comprising input and output means; amplifying means having an input and output, with said amplifying means output coupled to said output means, for generating a first pulse; capacitive means connected between said input means and said input of said amplifying means for holding a voltage supplied by said input means; and a first switching MOS transistor having a gate connected to receive said first pulse signal and a channel connected between said input and output of said amplifying means, which first switching MOS transistor operates in a conductive or nonconductive mode for executing a switching operation in response to the first pulse signal from said first pulse signal generating means to set the voltage at said output means at a level corresponding to said voltage held by said capacitive means and a first feedthrough error voltage from said first pulse signal delivered to said output means through the gate-channel path of said first switching MOS transistor after said first switching MOS transistor switches from the nonconductive to the conductive mode, the improvement comprising:
   means for reducing said first feedthrough error voltage comprising a low pass filter circuit coupled between the gate of said first switching MOS transistor and said first pulse signal generating means and having a time constant selected to reduce undershoot and overshoot components of said first pulse signal.

9. A semiconductor circuit according to claim 8, wherein said amplifying means is an inverting amplifier circuit.

10. A semiconductor circuit according to claim 9, wherein said input means comprises first and second input terminals; second and third pulse signal generating means for generating second and third pulse signals, respectively; and second and third switching MOS transistors each having a gate connected to receive said second and third pulse signals, respectively, and each having a channel connected between said first and second input terminals, respectively, and the input of said amplifying means through said capacitive means, which second and third switching MOS transistors operate in a conductive or nonconductive mode for executing switching operations in response to the second and third pulse signals, respectively, to set the voltage level in said capacitive means at a level corresponding to voltages at said first and second input terminals, a second feedthrough error voltage from said second pulse signal delivered to said capacitive means through the gate-channel path of said second switching MOS transistor, and a third feedthrough error voltage from said third pulse signal delivered to said capacitive means through the gate-channel path of said third switching MOS transistor after said second and third switching MOS transistors switch from the nonconductive to the conductive mode, the improvement further comprising:

means for reducing said second feedthrough error voltage comprising a second low-pass filter circuit coupled between the gate of said second MOS switching transistor and said second pulse signal generating means and having a time constant selected to reduce undershoot and overshoot components of said second pulse signal; and means for reducing said third feedthrough error voltage comprising a third low-pass filter circuit coupled between the gate of said third switching MOS transistor and said third pulse signal generating means and having a time constant selected to reduce undershoot and overshoot components of said third pulse signal.

* * * * *